United States Patent
Lee (10) Patent No.: US 8,209,571 B2
(45) Date of Patent: Jun. 26, 2012

(54) VALID-TRANSMISSION VERIFYING CIRCUIT AND A SEMICONDUCTOR DEVICE INCLUDING THE SAME

(75) Inventor: Chang-Hwan Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1733 days.

(21) Appl. No.: 11/493,438

(22) Filed: Jul. 26, 2006

(65) Prior Publication Data

US 2007/0028154 A1 Feb. 1, 2007

(30) Foreign Application Priority Data

Jul. 26, 2005 (KR) .................. 10-2005-0067727

(51) Int. Cl.
*G01R 31/28* (2006.01)
*G11C 29/00* (2006.01)
*G06F 11/00* (2006.01)

(52) U.S. Cl. ......... 714/715; 714/723; 714/733; 714/736

(58) Field of Classification Search .......... 714/712–723; 375/371, 368
See application file for complete search history.

(56) References Cited

U.S. PATENT DOCUMENTS

| 7,047,458 | B2 * | 5/2006 | Nejedlo et al. | ................ 714/715 |
| 7,408,371 | B2 * | 8/2008 | Kim et al. | .................. 324/750.3 |
| 2002/0144195 | A1 * | 10/2002 | Ramanathan et al. | .......... 714/55 |
| 2005/0094448 | A1 * | 5/2005 | Lee et al. | ...................... 365/200 |

FOREIGN PATENT DOCUMENTS

| JP | 8146091 | 6/1996 |
| KR | 100205219 | 4/1999 |
| KR | 1020030058820 | 7/2003 |
| KR | 1020050042972 | 5/2005 |
| KR | 1020050066199 | 6/2005 |

* cited by examiner

*Primary Examiner* — Jeffrey A Gaffin
*Assistant Examiner* — Daniel McMahon
(74) *Attorney, Agent, or Firm* — F. Chau & Associates, LLC (57) ABSTRACT

A valid-transmission verifying circuit and a semiconductor device including the same are provided. The valid-transmission verifying circuit provides data to an output circuit in correspondence with reference data, the valid-transmission verifying circuit comprising: a data receiving terminal receiving the reference data; a valid-transmission verifier including a reference load unit configured to sample the reference data, the data sampling operation is interrupted in response to a sampling control signal to determine whether the data sampling operation has been performed within a sampling time; and a selection switch providing the reference data to one of the normal output circuit and the valid-transmission verifier in response to a mode selection signal.

21 Claims, 9 Drawing Sheets

VALID-TRANSMISSION VERIFYING CIRCUIT AND A SEMICONDUCTOR DEVICE INCLUDING THE SAME

CROSS-REFERENCE TO RELATED APPLICATION

This U.S. non-provisional patent application claims priority under 35 U.S.C. §119 to Korean Patent Application No. 2005-67727, filed on Jul. 26, 2005, the disclosure of which is incorporated by reference herein in its entirety.

BACKGROUND OF THE INVENTION

1. Technical Field

The present invention is related to semiconductor devices, and more particularly, to a valid-transmission verifying circuit for determining whether data has been transmitted to another device within a predetermined time and a semiconductor device including the same.

2. Discussion of the Related Art

Generally, semiconductor devices provide signals or data to another device by way of output pads connected to their output terminals. In this approach, the load between the output pads and another device is typically estimated at a relatively small capacitance value of about 30 pF. When a semiconductor device has such a load between its output pads and another device, a valid-transmission verifying test is carried out to determine whether data output therefrom has been transmitted to another device within a predetermined time.

Figure 1:
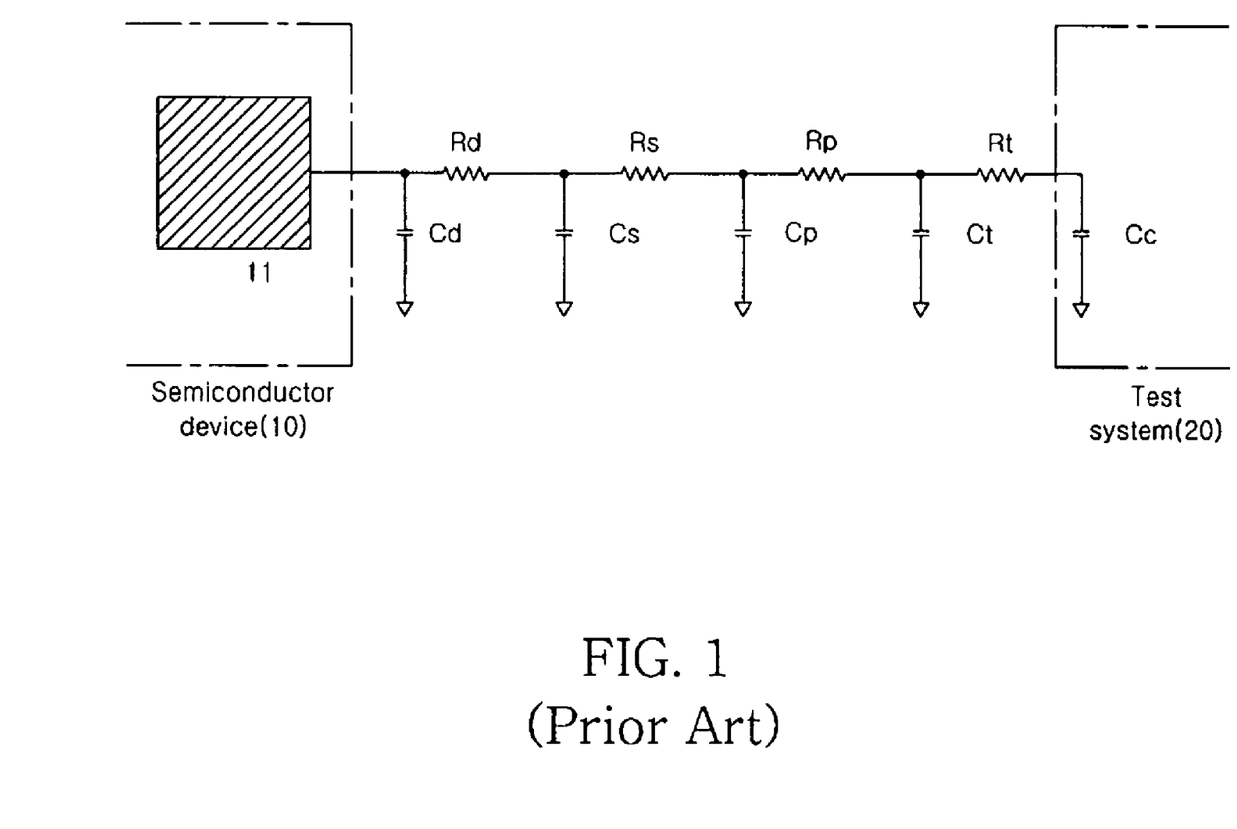
FIG. 1 is a circuit diagram for describing a valid-transmission test in a conventional semiconductor device.

FIG. 1 is a circuit diagram for describing a valid-transmission test in a conventional semiconductor device. The valid-transmission test is carried out by using a direct transmission test that applies signals or data directly to a test system 20 from a normal output circuit 11 such as an output pad of a semiconductor device 10. In the direct transmission test, the test system 20 receives data or signals from the normal output circuit 11, and verifies that the data or signals are effectively transferred thereto by analyzing the received data or signals.

During this process, various types of parasitic capacitance and resistance between the normal output circuit 11 and the test system 20 are generated. FIG. 1 also illustrates a pattern of the parasitic capacitances and resistances that may be generated. For example, in FIG. 1, Rd and Cd represent resistance and capacitance, respectively, at a test socket. Rp and Cp represent resistance and capacitance, respectively, at a test board. Rt and Ct represent resistance and capacitance, respectively, at a transmission line and Cc represents capacitance at a receiving part of the test system 20.

However, here, the sum of the parasitic capacitance between the test system 20 and the normal output circuit 11 is a relatively large value of about 70 pF. This value is much larger than the estimated capacitance of about 30 pF. As a result, the valid-transmission test must consider speed margins that change due to the parasitic capacitance. Thus, because the valid-transmission test is not capable considering all the differences between the practical and expected values of parasitic capacitance resulting from various testing conditions, the reliability of the test may be greatly affected.

As such, a need exists for a device that is capable of reliably performing a valid-transmission test in a semiconductor device without regard to external testing conditions.

SUMMARY OF THE INVENTION

An embodiment of the present invention is directed to providing a valid-transmission verifying circuit capable of improving the reliability of a valid-transmission test, and a semiconductor device including the valid-transmission verifying circuit.

An aspect of the invention is a valid-transmission verifying circuit that provides data to an output circuit in correspondence with reference data, comprising: a data receiving terminal receiving the reference data; a valid-transmission verifier including a reference load unit configured to sample the reference data, the data sampling operation is interrupted in response to a sampling control signal to determine whether the data sampling operation has been performed within a sampling time; and a selection switch providing the reference data to one of the output circuit and the valid-transmission verifier in response to a mode selection signal.

Another aspect of the invention is a valid-transmission verifying circuit that provides data to an output circuit in correspondence with a plurality of input data, comprising: a multiplexer selecting one of the plurality of input data as reference data; a valid-transmission verifier including a reference load unit, the reference load unit is driven to conduct a data sampling operation for the reference data, the data sampling operation is interrupted in response to a sampling control signal to determine whether the data sampling operation has been performed within a sampling time; and a selection switch providing the reference data to one of the normal output circuit and the valid-transmission verifier in response to a mode selection signal.

Yet another aspect of the invention is a semiconductor device comprising: a memory array storing data; an output circuit, the output circuit is driven to transmit data from the semiconductor device in correspondence with the data stored in the memory array; a transmission circuit transferring the data from the memory array to the output circuit; a valid-transmission verifying circuit including a reference load unit, the reference load unit sampling data to be transferred to the output circuit, the valid-transmission verifying circuit determining whether the data sampling has been performed within a sampling time; and a control circuit generating signals to operate the valid-transmission verifying circuit.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals in the drawings refer to like elements throughout the specification.

Figure 2:
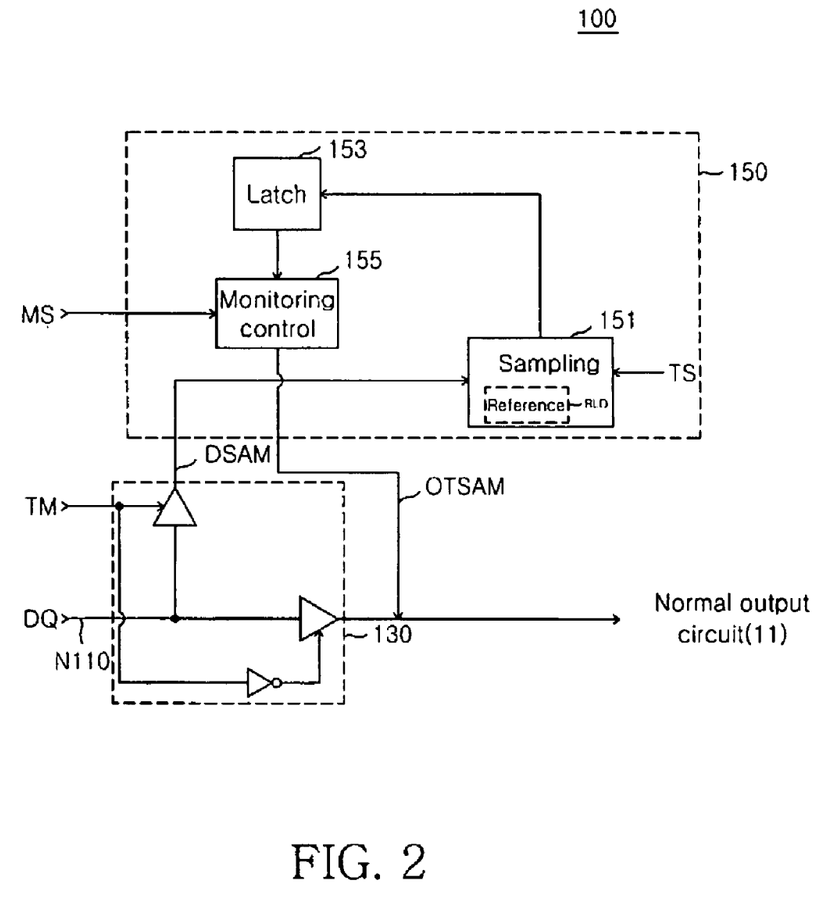
FIG. 2 is a circuit diagram illustrating a valid-transmission verifying circuit of a semiconductor device in accordance with an exemplary embodiment of the invention.

FIG. 2 is a circuit diagram illustrating a valid-transmission verifying circuit 100 of a semiconductor device in accordance with an embodiment of the invention. The valid-transmission verifying circuit 100 provides data to the normal output circuit 11 in correspondence with reference data DQ. The normal output circuit 11 may be an output pad or an output driver.

Referring to FIG. 2, the valid-transmission verifying circuit 100 is comprised of a data receiving terminal N110, a selection switch 130, and a valid-transmission verifier 150. The data receiving terminal N110 receives the reference data DQ. The data receiving terminal N110 may be implemented in various forms, for example, the data receiving terminal N110 may be implemented as a single terminal as shown in FIG. 2 or it may be implemented to have more than one terminal.

The selection switch 130 is driven to transfer the reference data DQ to one of the normal output circuit 11 and the valid-transmission verifier 150 in response to a predetermined mode selection signal TM. When performing a valid-transmission test by using the valid-transmission verifying circuit 100, the mode selection signal TM is set to logic "H". For example, the mode selection signal TM is set to logic "high". During this time, the selection switch 130 provides the reference data DQ to the valid-transmission verifier 150. If the valid-transmission verifying circuit 100 is not in the valid-transmission test mode, the mode selection signal TM is set to logic "L". For example, the mode selection signal TM is set to logic "low". During this time, the selection switch 130 provides the reference data DQ to the normal output circuit 11.

As further shown in FIG. 2, the valid-transmission verifier 150 includes a reference load unit RLD that is driven to conduct a data sampling operation in correspondence with the reference data DQ. To confirm a sampling time tSAM for data by using the reference load unit RLD, the data sampling operation is terminated in response to a sampling control signal TS. For instance, after the sampling time tSAM lapses, the sampling control signal TS goes to logic "L" to terminate the data sampling operation.

The valid-transmission verifier 150 is comprised of a sampling circuit 151, a latch circuit 153, and a monitoring circuit 155. The sampling circuit 151 includes the reference load unit RLD, and models and stores information of an estimated load between the normal output circuit 11 and another device. For example, if the estimated load between the normal output circuit 11 and another device is 30 pF, the sampling circuit 151 prepares a capacitor of 30 pF to be inserted therebetween. In addition, if the estimated load between the normal output circuit 11 and another device is 30 pF with a parasitic resistance, the sampling circuit 151 prepares a capacitor of 30 pF and a resistor in correspondence with the estimated parasitic capacitance and resistance to be inserted therebetween.

The sampling circuit 151 conducts the sampling operation for data DSAM provided from the selection switch 130. The sampling operation is interrupted when the sampling control signal TS transitions to "L".

Figure 3:
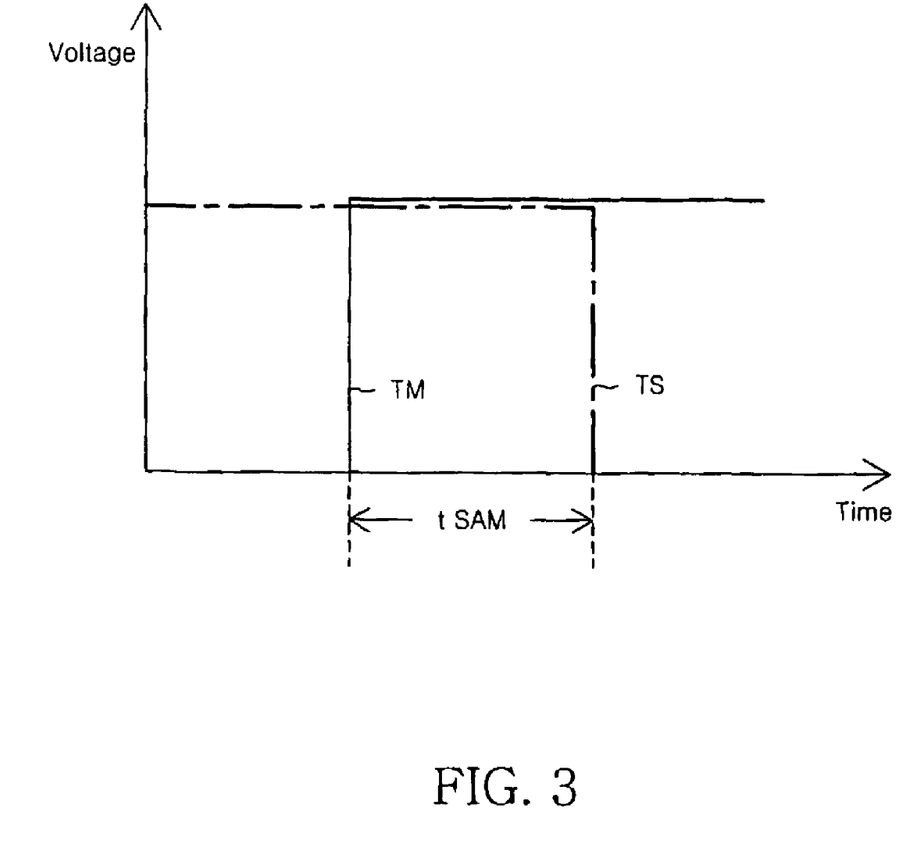
FIG. 3 is a graph showing operational timings of a sampling control signal and a mode selection signal used in the circuit of FIG. 2.

As illustrated in FIG. 3, when an active time of the mode selection signal TM transitions to logic "H", the sampling time tSAM begins and when the sampling control signal TS transitions to logic "L", the sampling time tSAM ends. Thus, during the sampling time tSAM, the sampling circuit 151 may perform the data sampling operation with the reference data DQ.

If the reference data DQ is received after the active time of the mode selection signal TM, in other words, when the mode selection signal TM is set to logic "H", the sampling control signal TS may be designed to transition to logic "L" after the sampling time tSAM ends. The sampling control signal TS may be provided from an external source or it may be internally generated.

In addition, the sampling time tSAM may be set as a permissible transmission time for transferring data to another device in accordance with a permissible data transfer time set by a specification of the semiconductor device. For instance, when the permissible transmission time is 20 ns, the sampling time tSAM is set to be 20 ns.

Referring back to FIG. 2, the latch circuit 153 temporarily stores data that is sampled by the sampling circuit 151. The monitoring circuit 155 outputs the data from the latch circuit 153 in response to a predetermined result confirmation signal MS.

When checking the data output from the latch circuit 153, the monitoring circuit 155 is able to confirm that data can be effectively sampled within the sampling time tSAM in accordance with the reference load unit RLD. In addition, the monitoring circuit 155 is also able to confirm that the data transmitted from the normal output circuit 11 to another device can be completed within the permissible transmission time indicated by the specification of the semiconductor device.

Further, the valid-transmission verifier 150 provides the sampled data OTSAM to the normal output circuit 11 in response to the result confirmation signal MS. As such, by accepting signals or data from the normal output circuit 11, a test system is able to determine the value of data held at the latch circuit 153 in a relatively easy manner.

Figure 4:
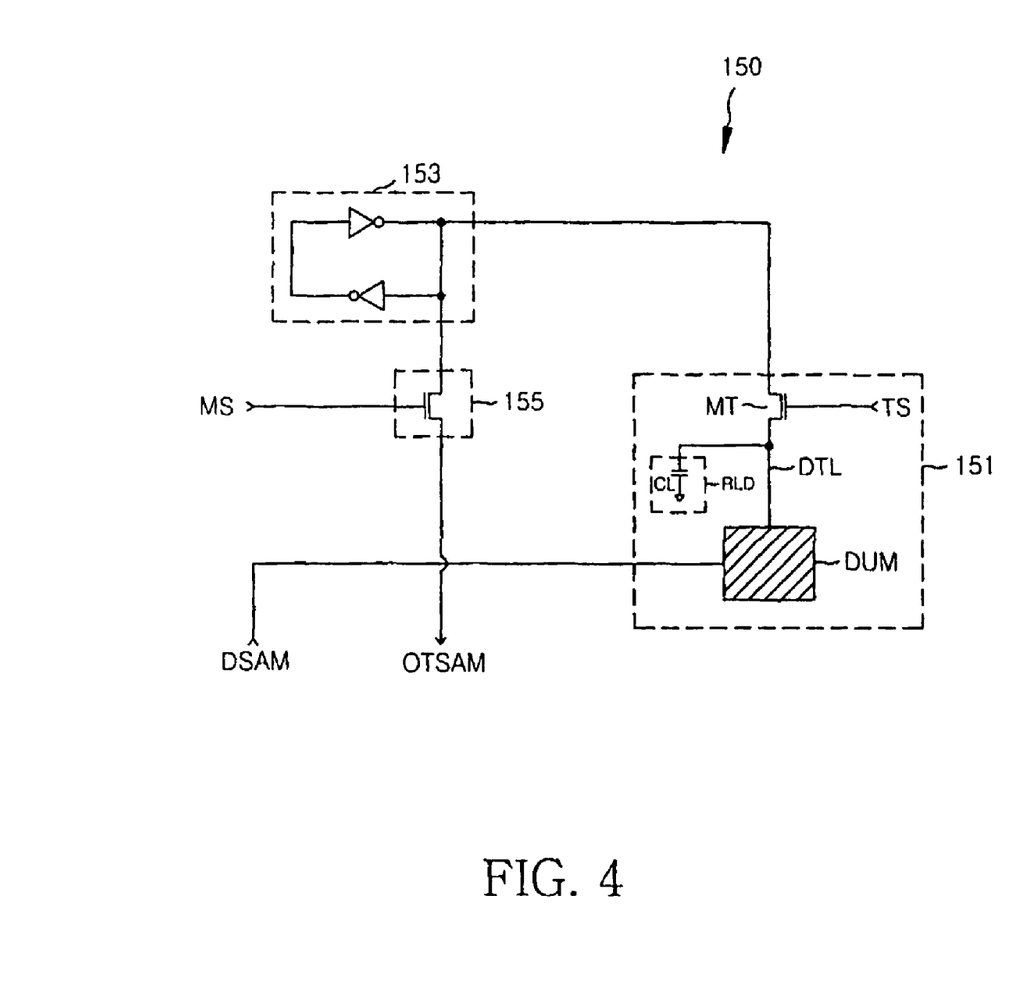
FIGS. 4 and 5 are circuit diagrams illustrating exemplary embodiments of a valid-transmission verifier shown in FIG. 2.

FIG. 4 is a circuit diagram illustrating an embodiment of the valid-transmission verifier 150 shown in FIG. 2. In FIG. 4, the sampling circuit 151 is comprised of a dummy unit DUM, a transmission unit MT, and the reference load unit RLD.

The dummy unit DUM receives data from the selection switch 130. The dummy unit DUM is designed by modeling it to reflect the load of the normal output circuit 11. When the normal output circuit 11 is a pad, the dummy unit DUM is implemented as a pad having the same pattern as the normal output circuit 11.

The transmission unit MT transfers data from the dummy unit DUM to the latch circuit 153 in response to the sampling control signal TS. The transmission unit MT may be implemented in various circuit patterns such as a transistor, transmission gate, and so forth.

In the valid-transmission verifier 150 shown in FIG. 4, the reference load unit RLD is interposed between the dummy unit DUM and the transmission unit MT. The reference load unit RLD includes a capacitor CL connected to a data transmission line DTL arranged between the dummy unit DUM and the transmission unit MT. The capacitance of the reference load unit RLD may be regulated by an external means.

In FIG. 4, the reference load unit RLD is designed to perform a test operation for data transmitted in the form of an open load type that operates with capacitance.

In FIG. 4, the latch circuit 153 is constructed of two cross-coupled inverters and the monitoring circuit 155 is constructed of an NMOS transistor that is gated in response to the result confirmation signal MS.

Using the valid-transmission verifying circuit 100, the valid-transmission test is capable of determining whether data has been transmitted to another device within the permissible transmission time set by the specification of the semiconductor device without regard to external testing conditions.

Figure 5:
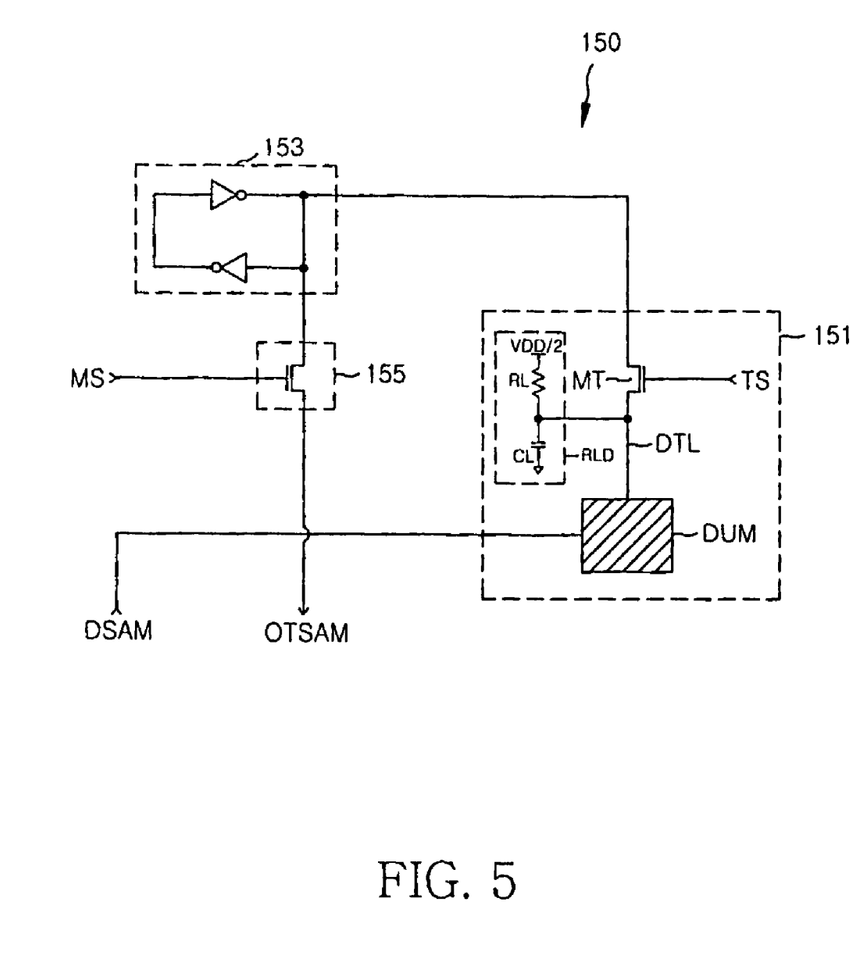

FIG. 5 is a circuit diagram illustrating another embodiment of the valid-transmission verifier 150 shown in FIG. 2. As shown in FIG. 5, the valid-transmission verifier 150 includes the same components as that of FIG. 4, except that the reference load unit RLD includes a capacitor CL and a resistor RL. In this configuration, the reference load unit RLD may be used to test data transmitted in the form of a termination load that operates with resistance and capacitance.

Figure 6:
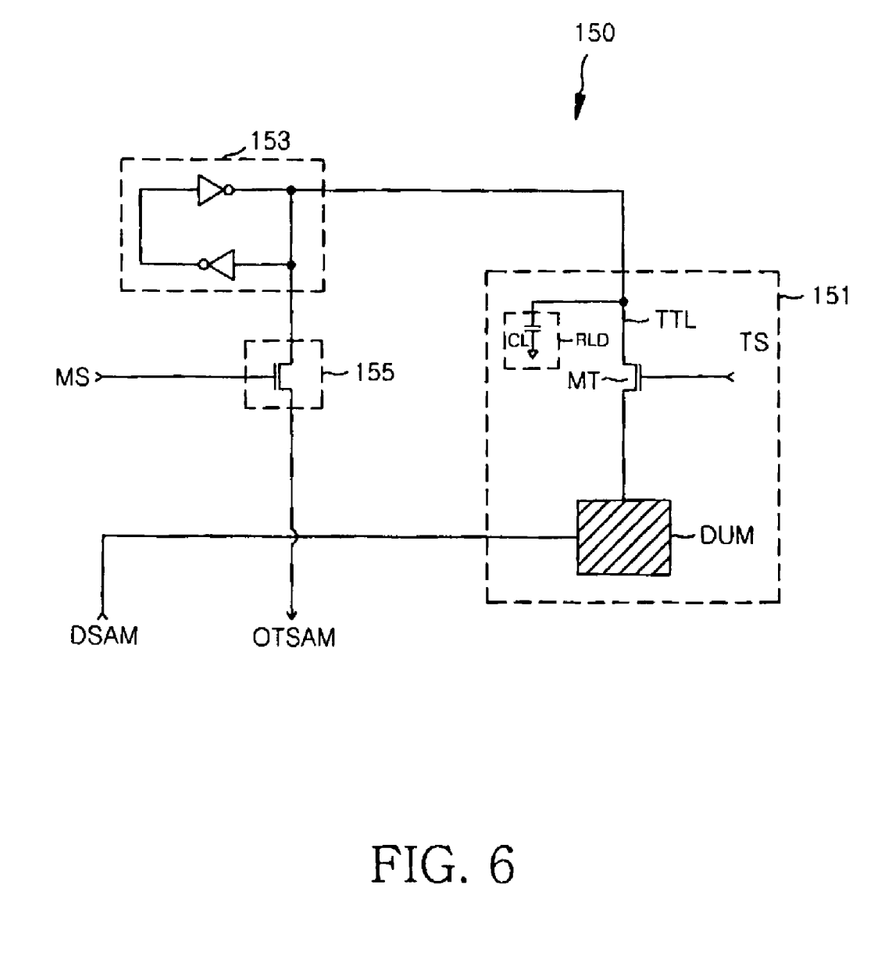
FIGS. 6 and 7 are circuit diagrams illustrating other exemplary embodiments of the valid-transmission verifier shown in FIG. 2.
Figure 7:
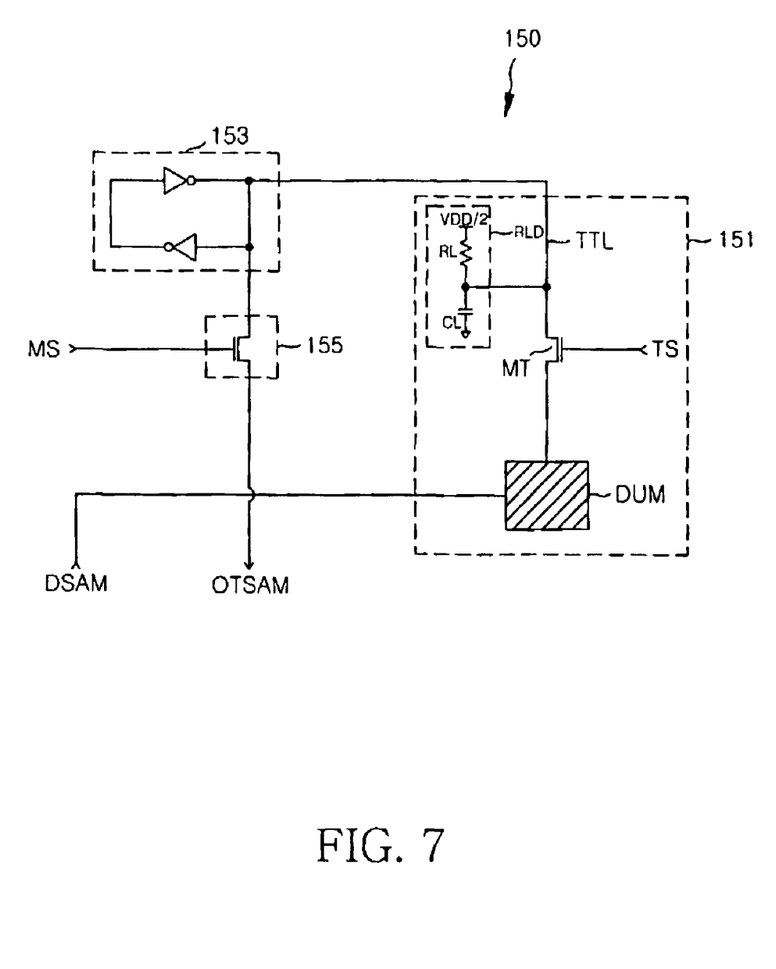

FIGS. 6 and 7 are circuit diagrams illustrating other embodiments of the valid-transmission verifier 150 shown in FIG. 2. The valid-transmission verifiers 150 shown in FIGS. 6 and 7 perform test operations for data transmitted in the form of open and termination load types, respectively.

The valid-transmission verifiers shown in FIGS. 6 and 7 are similar to or the same as those shown in FIGS. 4 and 5. Accordingly, a description of the same components will not be repeated.

In contrast to that shown in FIG. 4, in FIG. 6, the reference load unit RLD includes a capacitor CL connected to a data transmission line TTL that is arranged between the latch circuit 153 and the transmission unit MT. In contrast to that shown in FIG. 5, in FIG. 7, the reference load unit RLD includes a capacitor CL and a resistor RL connected to the data transmission line TTL that is arranged between the latch circuit 153 and the transmission unit MT.

Thus, a valid-transmission verifying circuit employing the valid-transmission verifier 150 shown in FIGS. 6 or 7 is capable of determining whether data has been transmitted to another device within the permissible transmission time set by the specification of the semiconductor device without regard to external testing conditions.

Figure 8:
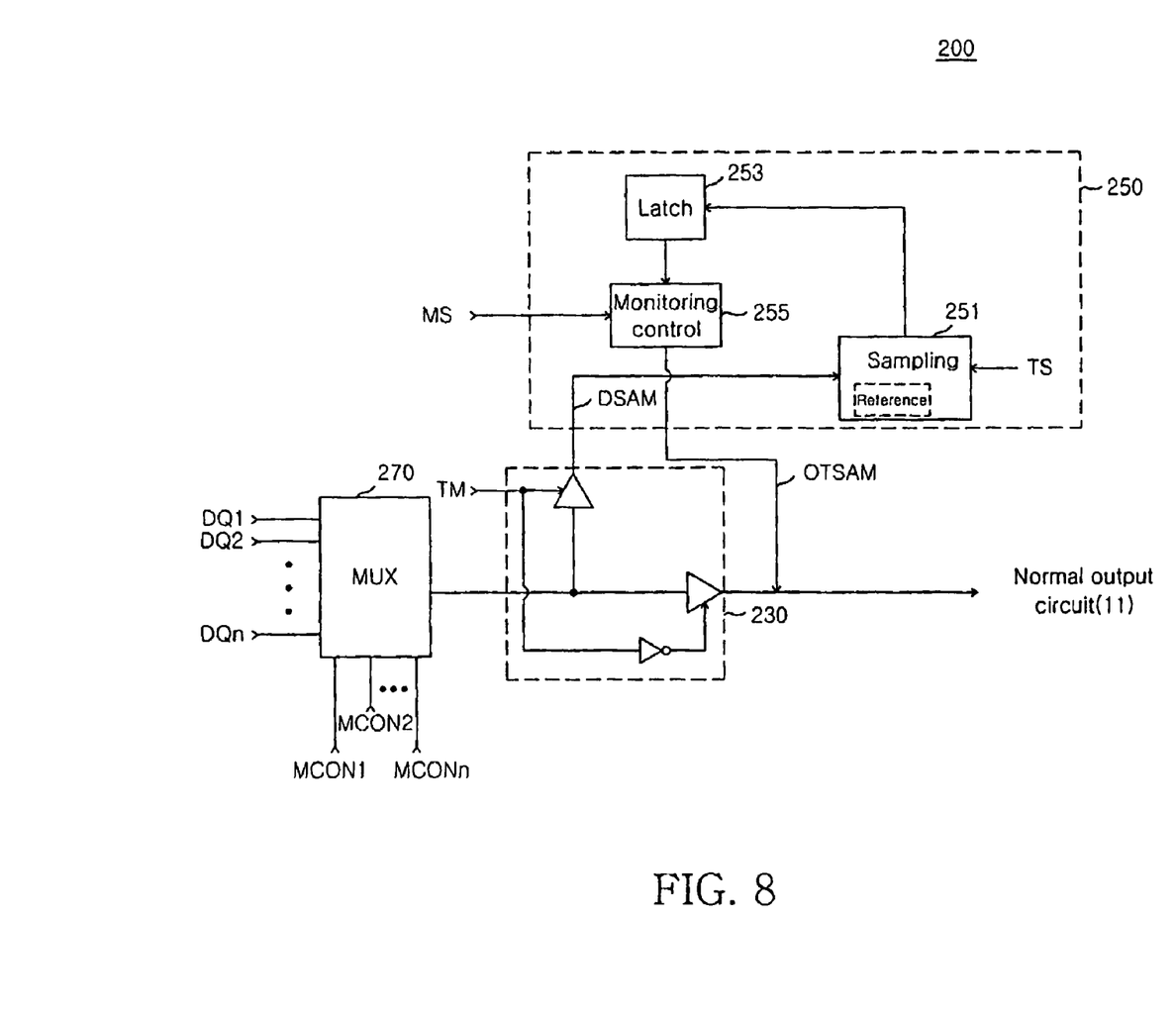
FIG. 8 is a circuit diagram illustrating a valid-transmission verifying circuit of a semiconductor device in accordance with another exemplary embodiment of the invention.

FIG. 8 is a circuit diagram illustrating a valid-transmission verifying circuit 200 of a semiconductor device in accordance with another embodiment of the invention.

As shown in FIG. 8, the valid-transmission verifying circuit 200 selectively provides data to the normal output circuit 11 in correspondence with a plurality of input data DQ1~DQn. The valid-transmission verifying circuit 200 is comprised of a selection switch 230, a valid-transmission verifier 250, and a multiplexer 270. The valid-transmission verifying circuit 200 of FIG. 8 is similar to that of the valid-transmission verifying circuit 100 of FIG. 2 except that it includes the multiplexer 270. Accordingly, a description of the same components will not be repeated. The multiplexer 270 selects one of the input data DQ1~DQn as the reference data DQ in response to a plurality of multiplexer control signals MCON1~MCONn.

Similar to that as shown in FIG. 2, the selection switch 230 is driven to provide the reference data DQ to one of the normal output circuit 11 and the valid-transmission verifier 250.

In addition, the valid-transmission verifier 250 includes the reference load unit RLD that is driven to conduct the data sampling operation in correspondence with the reference data DQ. Further, the data sampling operation is interrupted when the sampling control signal TS transitions to logic "L" to determine whether the data sampling operation has been performed within the sampling time tSAM.

Figure 9:
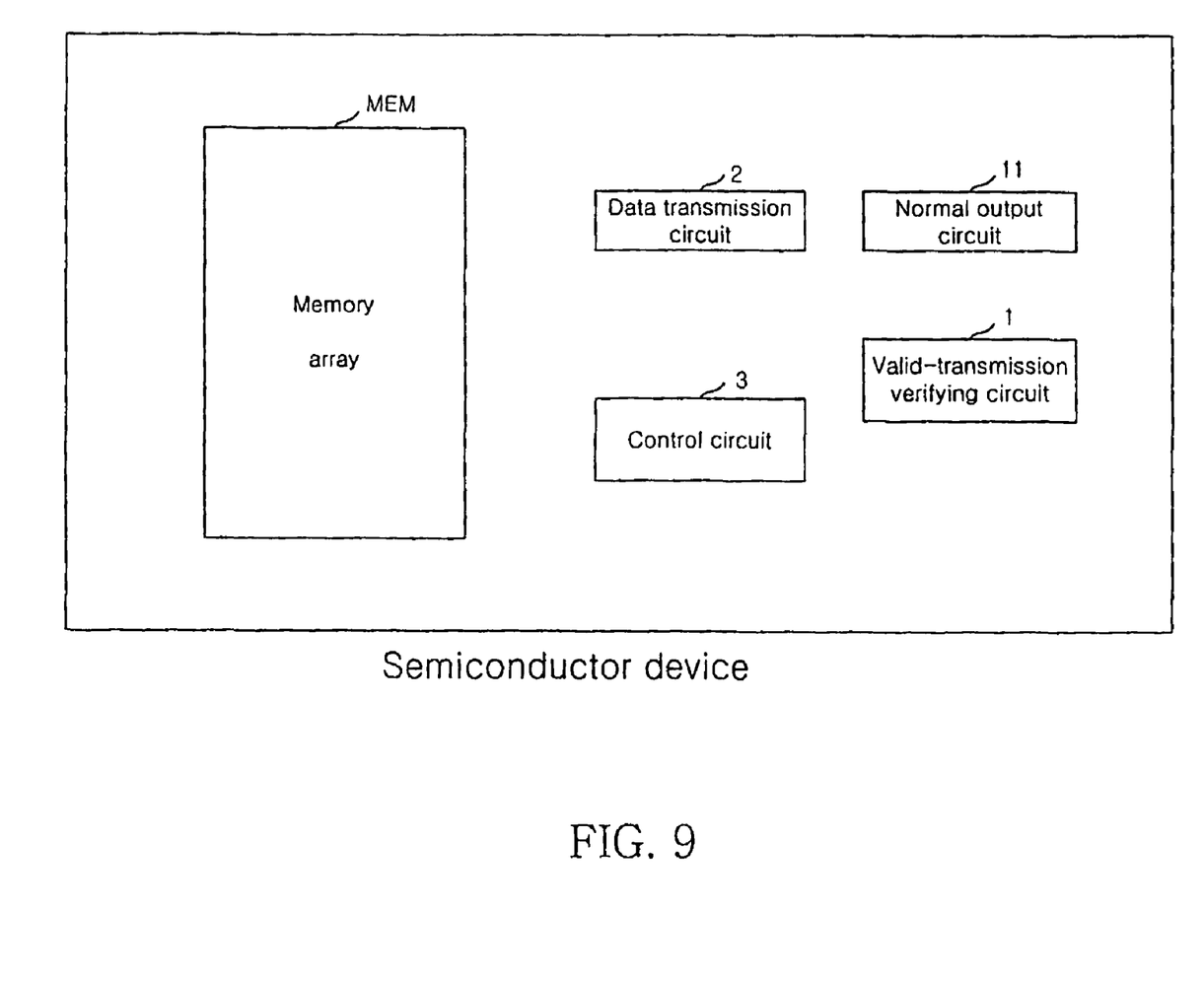
FIG. 9 is a block diagram illustrating a semiconductor device according to an exemplary embodiment of the invention.

FIG. 9 is a block diagram illustrating a semiconductor device according to an embodiment of the invention. Referring to FIG. 9, the semiconductor device is comprised of a memory array MEM, a valid-transmission verifying circuit 1, a data transmission circuit 2, a control circuit 3, and the normal output circuit 11.

The memory array MEM is composed of a plurality memory cells arranged in a matrix structure of rows and columns. The memory cells store predetermined data. The normal output circuit 11 is driven to transmit data from the semiconductor device in correspondence with data stored in the memory array MEM.

The data transmission circuit 2 transfers data from the memory array MEM to the normal output circuit 11. The control circuit 3 generates signals to operate the valid-transmission verifying circuit 1 and other components.

The valid-transmission verifying circuit 1 may be the valid-transmission verifying circuit 100 shown in FIG. 2.

In addition, the valid-transmission verifying circuit 1 may be the valid-transmission verifying circuit 200 of FIG. 8.

Although the present invention has been shown and described in connection with the exemplary embodiments thereof, it will be apparent to those of ordinary skill in the art that various substitutions, modifications and changes may be made thereto without departing from the scope and spirit of the invention as defined by the following claims.

What is claimed is:

1. A valid-transmission verifying circuit that provides data to an output circuit in correspondence with reference data, comprising:
   a data receiving terminal receiving the reference data;
   a valid-transmission verifier including a reference load unit configured to sample the reference data, the data sampling operation is interrupted in response to a sampling control signal to determine whether the data sampling operation has been performed within a sampling time; and
   a selection switch providing the reference data to one of the output circuit and the valid-transmission verifier in response to a mode selection signal,
   wherein the valid-transmission verifier comprises:
   a sampling circuit including the reference load unit and conducting the data sampling operation for the reference data, wherein the reference data is provided from the selection switch in response to the sampling control signal;
   a latch circuit holding the reference data sampled by the sampling circuit; and
   a monitoring circuit outputting the reference data from the latch circuit in response to a result confirmation signal.

2. The valid-transmission verifying circuit as set forth in claim 1, wherein the valid-transmission verifier provides the sampled data to the output circuit in response to the result confirmation signal.

3. The valid-transmission verifying circuit as set forth in claim 1, wherein the sampling circuit comprises:
   a dummy unit receiving the reference data from the selection switch, wherein the reference data reflects a load of the output circuit;
   a transmission unit transferring the reference data from the dummy unit to the latch circuit in response to the sampling control signal; and
   the reference load unit connected between the dummy unit and the transmission unit.

4. The valid-transmission verifying circuit as set forth in claim 3, wherein the reference load unit comprises a capacitor connected to a data transmission line arranged between the dummy unit and the transmission unit.

5. The valid-transmission verifying circuit as set forth in claim 4, wherein the reference load unit further comprises a resistor connected to the data transmission line arranged between the dummy unit and the transmission unit.

6. The valid-transmission verifying circuit as set forth in claim 1, wherein the sampling circuit comprises:
   a dummy unit receiving the reference data from the selection switch, wherein the reference data reflects a load of the output circuit;
   a transmission unit transferring the reference data from the dummy unit to the latch circuit in response to the sampling control signal; and
   the reference load unit connected between the latch circuit and the transmission unit.

7. The valid-transmission verifying circuit as set forth in claim 6, wherein the reference load unit comprises a capacitor connected to a data transmission line arranged between the latch circuit and the transmission unit.

8. The valid-transmission verifying circuit as set forth in claim 7, wherein the reference load unit further comprises a resistor connected to the data transmission line arranged between the latch circuit and the transmission unit.

9. The valid-transmission verifying circuit as set forth in claim 1, wherein the output circuit is an output pad or an output driver.

10. A valid-transmission verifying circuit that provides data to an output circuit in correspondence with a plurality of input data, comprising:
   a multiplexer selecting one of the plurality of input data as reference data;
   a valid-transmission verifier including a reference load unit, the reference load unit is driven to conduct a data sampling operation for the reference data, the data sampling operation is interrupted in response to a sampling control signal to determine whether the data sampling operation has been performed within a sampling time; and
   a selection switch providing the reference data to one of the output circuit and the valid-transmission verifier in response to a mode selection signal, wherein the valid-transmission verifier comprises:
   a sampling circuit including the reference load unit and conducting the data sampling operation for the reference data, wherein the reference data is provided from the selection switch in response to the sampling control signal;
   a latch circuit holding the reference data sampled by the sampling circuit; and
   a monitoring circuit outputting the reference data from the latch circuit in response to a result confirmation signal.

11. The valid-transmission verifying circuit as set forth in claim 10, wherein the valid-transmission verifier provides the sampled data to the output circuit in response to the result confirmation signal.

12. The valid-transmission verifying circuit as set forth in claim 10, wherein the sampling circuit comprises:
   a dummy unit receiving the reference data from the selection switch, wherein the reference data reflects a load of the output circuit;
   a transmission unit transferring the reference data from the dummy unit to the latch circuit in response to the sampling control signal; and
   the reference load unit connected between the dummy unit and the transmission unit.

13. The valid-transmission verifying circuit as set forth in claim 12, wherein the reference load unit comprises a capacitor connected to a data transmission line arranged between the dummy unit and the transmission unit.

14. The valid-transmission verifying circuit as set forth in claim 13, wherein the reference load unit further comprises a resistor connected to the data transmission line arranged between the dummy unit and the transmission unit.

15. The valid-transmission verifying circuit as set forth in claim 10, wherein the sampling circuit comprises:
   a dummy unit receiving the reference data from the selection switch, wherein the reference data reflects a load of the output circuit;
   a transmission unit transferring the reference data from the dummy unit to the latch circuit in response to the sampling control signal; and
   the reference load unit connected between the latch circuit and the transmission unit.

16. The valid-transmission verifying circuit as set forth in claim 15, wherein the reference load unit comprises a capacitor connected to a data transmission line arranged between the latch circuit and the transmission unit.

17. The valid-transmission verifying circuit as set forth in claim 16, wherein the reference load unit further comprises a resistor connected to the data transmission line arranged between the latch circuit and the transmission unit.

18. The valid-transmission verifying circuit as set forth in claim 10, wherein the output circuit is an output pad or an output driver.

19. A semiconductor device comprising:
   a memory array storing data;
   an output circuit, the output circuit is driven to transmit data from the semiconductor device in correspondence with the data stored in the memory array;
   a transmission circuit transferring the data from the memory array to the output circuit;
   a valid-transmission verifying circuit including a reference load unit, the reference load unit sampling data to be transferred to the output circuit, the valid-transmission verifying circuit determining whether the data sampling has been performed within a sampling time; and
   a control circuit generating signals to operate the valid-transmission verifying circuit,
   wherein the valid-transmission verifying circuit comprises:
   a sampling circuit including the reference load unit and conducting the data sampling operation for the data to be transferred to the output circuit, wherein the data to be transferred to the output circuit is provided to the valid-transmission verifying circuit in response to a first control signal from the control circuit;
   a latch circuit holding the data sampled by the sampling circuit; and
   a monitoring circuit outputting the data from the latch circuit in response to a second control signal from the control circuit.

20. The semiconductor device as set forth in claim 19, wherein the sampling time begins when a mode transition signal is logic high and the sampling time ends when a sampling control signal is logic low.

21. The semiconductor device as set forth in claim 19, wherein the output circuit is an output pad or an output driver.

* * * * *